United States Patent
Kikuchi et al.

(10) Patent No.: US 6,563,200 B2
(45) Date of Patent: May 13, 2003

(54) INTERFACE DEVICE AND INTERFACE SYSTEM

(75) Inventors: Mutsumi Kikuchi, Hitachi (JP); Fumio Murabayashi, Urizura (JP); Takashi Sase, Hitachi (JP); Atsuo Watanabe, Hitachiohta (JP); Masatsugu Amishiro, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/940,790

(22) Filed: Aug. 29, 2001

(65) Prior Publication Data

US 2002/0105062 A1 Aug. 8, 2002

(30) Foreign Application Priority Data

Feb. 5, 2001 (JP) .......................................... 2001-028498

(51) Int. Cl.[7] .............................................. H01L 23/495
(52) U.S. Cl. ......................................... 257/666; 257/347
(58) Field of Search ............................... 257/666, 347, 257/784, 786; 73/784

(56) References Cited

U.S. PATENT DOCUMENTS 5,939,755 A * 8/1999 Takeuchi et al. ............ 257/347

FOREIGN PATENT DOCUMENTS

| JP | 11-136293 | 5/1999 |
| JP | 11-317445 | 11/1999 |

* cited by examiner

Primary Examiner—Phat X. Cao
(74) Attorney, Agent, or Firm—Dickstein Shapiro Morin & Oshinsky LLP

(57) ABSTRACT

In an interface device in which by means of a buried insulation film 412 and a region insulation portion 410 an SOI substrate 414 is divided into a semiconductor support substrate region 411, a controller side region 407 and a network side region 408 and a part of isolator circuits 405 and 406 making use of a static capacitance are formed in the network side region 408, the semiconductor support substrate region 411 and the network side region 408 are connected to a network power source to always keep these regions at a same potential, thereby, an interface device using a dielectric isolation substrate which suppresses erroneous operations due to noises and characteristic deterioration, and a system using the same are provided.

11 Claims, 11 Drawing Sheets

INTERFACE DEVICE AND INTERFACE SYSTEM

BACKGROUND OF THE INVENTION

1. Field of the Invention

The present invention relates to an interface device for connecting a control unit and a field apparatus such as sensor and actuator in a network which are, for example, used in a production line, and an interface system using the same.

2. Conventional Art

A conventional electric line connection to the field apparatus such as a sensor and an actuator which are used in a production line was generally constituted through an individual wiring.

Although, these days, such connection is being shifting toward a field network which permits a flexible system construction, however, in such instance an interface device for connecting to a network is necessitated.

Now, an interface necessitates a power source, and in a case of a system where many numbers of field apparatuses are connected to a network having a long laying distance via an interface, the electric power is usually supplied from the network to the interface.

In order to receive such electric power supply, the interface is required to include a regulator unit which converts the voltage supplied from the network into a voltage usable in the interface system, a transceiver for performing signal transmission and reception with the network, a controller unit such as microcomputer which controls a communication system and the field apparatus and an isolator which electrically isolates the network from the field apparatus.

Now, when the scale of the system enlarges, at an interface device located remote from the power source, a voltage drop due to the network increases and the interface device likely becomes inoperable, for this reason structure of the network is limited and the advantages of the field network can not fully make use of, therefore, it is necessary to reduce power consumption of such interface device.

In a conventional interface device a photo coupler is generally used as the isolator, however, the power consumption of such photo coupler is comparatively large and the size reduction thereof is difficult, because the photo coupler is a dedicated part for respective ICs.

For countermeasuring the above problem, for example, JP-A-11-317445 (1999) and JP-A-11-136293 (1999) disclose a semiconductor device of on-chip structure in which a dielectric isolation (DI) substrate such as a silicon on insulator (SOI) substrate is used as a circuit substrate and a static capacitor type isolator is mounted thereon.

By means of the above prior art, the electrical isolation is obtained by the static capacitor not using the photo coupler, therefore, if the interface device is constituted with such means, both small sizing and low power consumption can be easily achieved.

However, the above conventional art did not take into account the noise propagation by the dielectric isolation substrate which causes problems of erroneous operation of the circuits and deterioration of the elements.

When an interface device which is formed by integrating a transceiver unit and a capacitive type isolator unit on an SOI substrate is operated through power supply from the network, the interface device possibly operates erroneously due to noises from the network.

Namely, if noises come into the transceiver unit from the network, a voltage is induced even on a thin film semiconductor layer via a semiconductor support substrate and an erroneous operation due to noises is resultantly caused.

Further, in such instance, performance of the elements on the thin film semiconductor layer is possibly deteriorated due to the noises, which is caused by such as electric charge accumulation in a buried insulation film and occurrence of charge depletion.

Now, the influences of the noises in the conventional art will be further explained in detail with reference to FIG. 3, in a semiconductor device using a dielectric isolation substrate a buried insulation film 41 is formed within a semiconductor substrate as shown in the drawing, thereby, the semiconductor substrate is divided into two parts in its thickness direction, in that an isolated structure is formed one (the lower side in the drawing) as a semiconductor support substrate region 411 and the other (the upper side in the drawing) as a semiconductor region used for circuit element formation.

Further, the semiconductor region used for circuit element formation is further divided in its face direction by a region insulation portion (insulation channel) 410 into two kinds of thin film silicon layers of a controller side region 407 and a network side region 408.

Namely, in this instance, one piece of semiconductor substrate is divided into three kinds of regions by the region insulation portion 410 and the buried insulation film 412.

Herein, circuits formed in the controller side region 407 is electrically isolated from circuit formed in the network side region 408 and a necessary signal transmission passage is provided by an isolator portion via a static capacitor coupling.

The circuits in the network side region 408 are supplied by a power source V+ and V− in the network and the circuits in the controller side region 407 are supplied by a power source VDD2 and GND2 in the controller side.

On the other hand, the semiconductor support substrate region 411 is connected nowhere and is kept floating. Herein, the power source V+ and V− in the network is, for example, 24V and if a high voltage noise is induced in the network, the high voltage noise is applied to the network side region 408. The noise voltage at such instance sometimes reaches up to, for example, 500V.

Such noise is directly and electrostatically applied to the controller side region 407 from the network side region 408 via the region insulation portion 410 as well as since the semiconductor support substrate region 411 is kept floating, after inducing a noise voltage at the semiconductor support substrate region 411 via the buried film 412, the noise voltage is applied to the controller side region via the buried insulation film 412 in a voltage divided manner by a static capacitor.

At this moment, since the static capacitance formed by the region insulation portion 410 between the controller side region 407 and the network side region 408 shows merely a small value because of the thin thickness of respective regions 407 and 408, the noises directly applied via this portion does not cause a substantial problem.

On the other hand, since the semiconductor support substrate 410 adjoins with the controller side region 407 and the network side regions 408 through a single plane, a static capacitance formed between them is comparatively large and a noise voltage induced at the controller side region 407 from the network side region 408 via the buried insulation film 412 reaches comparatively high voltage.

At this moment, since the buried insulation film 412 accumulates charges and is depleted, the performance of the elements is deteriorated.

SUMMARY OF THE INVENTION

An object of the present invention is to provide an interface device using a dielectric isolation substrate which sufficiently suppresses an erroneous operation due to noises and performance deterioration, and a system using the same.

The above object is achieved by an interface device which is provided with at least two semiconductor regions separated from a support substrate region via a dielectric body and in which an electrical isolation between an integrated circuit formed in the respective semiconductor regions is provided by a static capacitance, and is further provided with means for keeping the potential of one of the semiconductor regions, in which the integrated circuits being connected to a network are formed, at a potential of a power source line for the network.

At this instance, the integrated circuits being connected to the side of the network can include a communication function for an integrated circuit in another interface device connected to the network.

Further, at this instance, the interface device can include a package and the support substrate region can be connected to a pin in the package via an electrode and a lead frame or alternatively the support substrate region can be connected to a power source electrode in the integrated circuits being connected to the side of the network.

Likely, the above object is achieved by an interface device which is provided with at least two semiconductor regions separated from a support substrate region via a dielectric body and in which an electrical isolation between integrated circuits formed in the respective semiconductor regions is provided by a static capacitance, and further in which the integrated circuits being connected to the side of the network are provided with a first device having a first break down voltage characteristic and a second device having a second break down voltage characteristic lower than the first break down voltage characteristic and the first device is supplied from a first power source and the second device is supplied from a second power source which is insulated from the first power source.

Further, the above object can be achieved by an interface system which is constituted by a plurality of above any interface devices connected via a common network.

Now, the problem of the above conventional art will be explained, in that because a potential difference between the thin film silicon layer and the semiconductor support substrate is caused and the element formed in the thin film silicon layer is affected by an electric field caused by the potential difference, the characteristic of the elements vary, accordingly, the problem can be resolved by a condition in which no potential difference is caused between the semiconductor support substrate and the thin film silicon layer.

Further, the interface device for the network is operated by being connected to the network. Namely, the power source potential of the circuits formed in the thin film layer being connected to the network varies in response to the power source potential variation in the network.

Accordingly, in order to prevent from causing a potential difference between the semiconductor support substrate and the thin film silicon layer connected to the network, if the semiconductor support substrate is connected to the network so that the potential of the semiconductor support substrate assumes the same potential of the network, the problem can be resolved.

As has been explained in connection with FIG. 3 prior art, the region forming the circuit elements are separated into the two regions of the network side region 408 and the controller side region 407 by the region insulation portion 410. Namely, the power source for the circuits formed in the network side region 408 is supplied from the network power source V+ and V−, and the controller side region 407 is electrically insulated from the network side region 408.

Therefore, if the semiconductor support substrate 411 is connected to the network, the network side region 408 and the semiconductor support substrate 411 are kept at the same potential as the network power source, therefore, even if a common noise is induced at the network power source line, no potential difference due to the noise is caused between the network side region 408 and the semiconductor support substrate 411.

Accordingly, with the above measure the influence of noises to the elements formed in the network side region 408 can be prevented.

On the other hand, the controller side region 407 is connected to the controller side power source VDD2 and GND2, and is electrically insulated from the network side region 408.

Accordingly, as in the above measure, when the semiconductor support substrate 411 is connected to the network, since the semiconductor support substrate 411 is connected to the network power source, if a common noise is induced at the network power source line, a potential difference due to the noise induced at the network power source line is caused between the controller side region 407 and the semiconductor support substrate 411, therefore, the elements formed in the controller side region 407 are possibly affected by the noise in the network.

Now, the elements formed on the SOI substrate include a kind of elements which is greatly affected by the network noise and another kind of elements which is little affected by the network noise.

For example, a MOS transistor having a high break down voltage is the former kind of elements which is likely affected by the noise and a usual MOS transistor which operates below 5V is the latter kind of elements which is hardly affected by the noise.

Since, the noise from the network affects the element from the side of the semiconductor support substrate, the elements of the kind of which element region is formed to extend near the region of the semiconductor support substrate side is likely affected by the noise, and on the contrary the elements of the kind of which region is formed thin on the surface of the semiconductor is hardly affected by the noise, because the elements are separated distantly from the semiconductor support substrate side.

Therefore, if the elements of the kind which are hardly affected by the noise are formed in the controller side region 407 and the elements of any kinds are formed in the network side region 408, the influence of the noise induced at the network power source line can be eliminated.

DESCRIPTION OF THE PREFERRED EMBODIMENTS

Hereinbelow, the interface device and the interface system according to the present invention will be explained in detail with reference to embodiments as shown.

Figure 1:
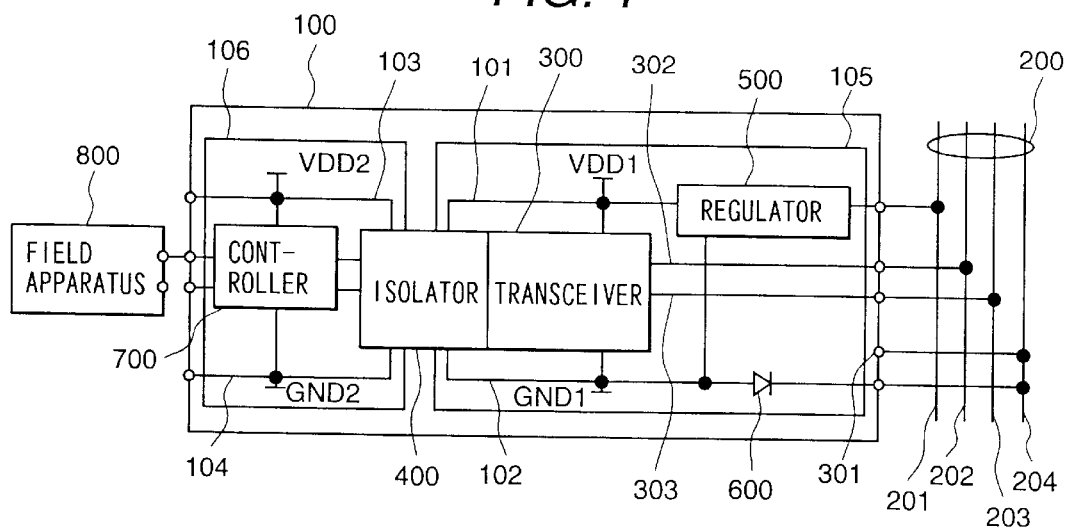
FIG. 1 is a block diagram showing a first embodiment of an interface device according to the present invention.

FIG. 1 is a first embodiment according to the present invention in which 100 is an interface device, and the interface device 100 is roughly constituted by a network side circuit 105 provided with a transceiver 300, a regulator 500 and a diode 600, and a controller side circuit 106 provided with a controller 700.

Further, the network side circuit 105 and the controller side circuit 106 are coupled under electrically insulated condition by an isolator 400 using a static capacitor, field apparatus 800 is designed to be connected to a network 200 via the interface device 100 and the network 200 is constituted by a first signal line 202, a second signal line 203, a first power source line 201 and a second power source line 204.

At first, the network side region 105 in the interface device 100 will be explained.

The regulator 500 is, for example, a general three terminal type, and is connected between the first source line 201 in the network 200 and a ground line 102 kept at GND1 (ground potential at the network side) and outputs VDD1 (power source potential at the network side in the interface device) to a power source line 101.

The ground line 102 is then connected to the second power source line 204 in the network 200 via the diode 600 used for an erroneous wiring protection.

A power source terminal of the transceiver 300 is connected to VDD1 power source line 101, and the GND terminal thereof is connected to GND1 ground terminal 102. Input and output signal terminals of the transceiver 300 are respectively connected to the first signal line 202 and the second signal line 203 in the network 200.

Herein, a terminal 301 is a terminal connected to a semiconductor support substrate in the interface device 100 and is further connected to the second power source line 204 in the network 200.

With regard to the power source of the isolator 400 which will be explained in detail later, the network side region 105 thereof is connected to VDD1 power source line 101 and GND1 ground line 102 in the network side, and the controller side region 106 thereof is connected to VDD2 power source line 103 and GND2 ground line 104 in the controller side.

Figure 2A:
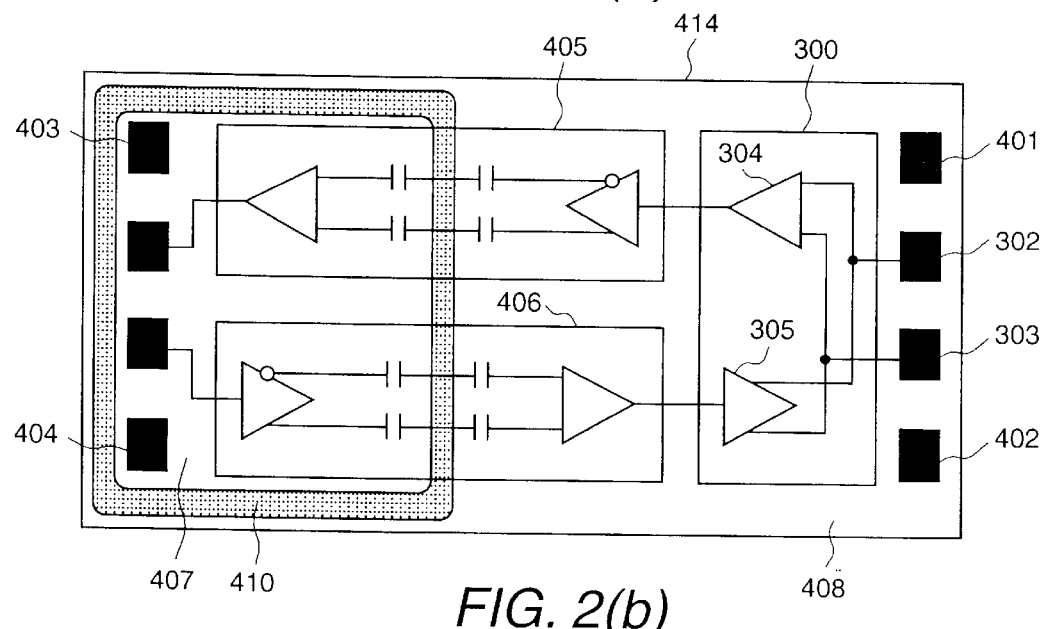
FIGS. 2(*a*) and 2(*b*) are explanatory views showing details of an isolator in the embodiment of the interface device according to the present invention.
Figure 2B:
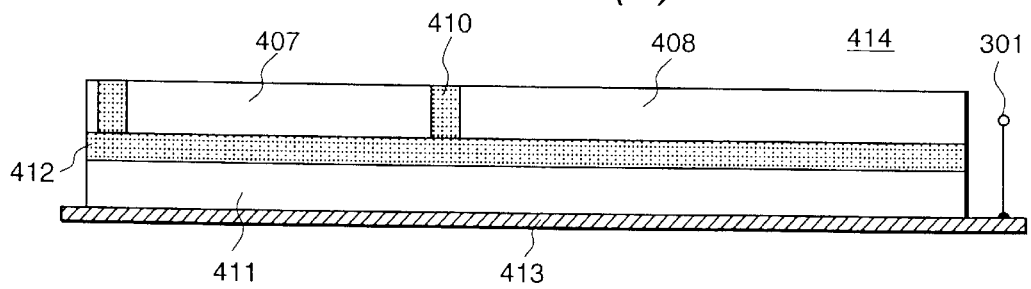
Figure 3:
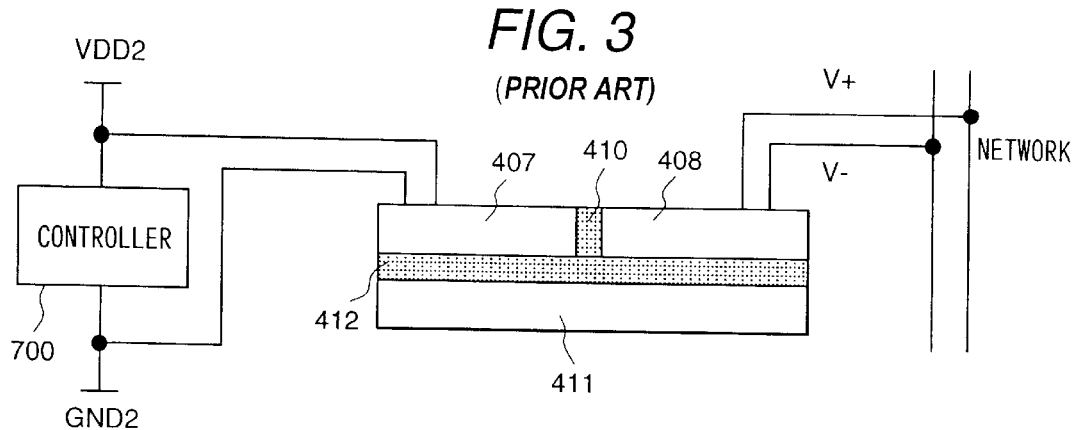
FIG. 3 is an explanatory view showing a conventional art example of an dielectric isolation substrate type interface device.

Now, the isolator 400 in the interface device 100 will be explained in detail with reference to FIGS. 2(a) and 2(b), which show an embodiment in which the transceiver 300 is formed on the same SOI substrate 414 and FIG. 2(a) is a plane view thereof and FIG. 2(b) is a schematic side view thereof.

In FIGS. 2(a) and 2(b), the isolator 400 is constituted by a signal reception use isolator circuit 405 and a signal transmission use isolator circuit 406 and is formed on the same SOI substrate 414 for the transceiver 300.

The SOI substrate 414 is provided with a semiconductor support substrate electrode 413, and at this instance the semiconductor region of the SOI substrate 414 is divided into to layers in its thickness direction by the buried insulation film 412 to have a separate structure, one as a semiconductor support substrate region 411 at the side of the semiconductor support substrate electrode 413, and the other as a semiconductor region forming circuit elements at the opposite side (the upper side in FIG. 2(b)).

Then, the semiconductor region for the circuit element formation at the upper side is further divided into two regions of a controller side region 407 and a network side region 408 by a region insulation portion (insulation channel) 410 as shown. Namely, the semiconductor substrate is divided into three regions by the region insulation portion 410 and the buried insulation film 412.

The signal reception use isolator 405 and the signal transmission use isolator 406 are respectively connected to a signal reception circuit 304 and a signal transmission circuit 305 at the side of the transceiver 300 and are further connected respectively to input and output signal terminals 701 and 702 at the side of the controller 700. Details of these isolator circuits 405 and 406 will be explained with reference to FIGS. 4(a) and 4(b).

The semiconductor support substrate region 411 is connected to the package terminal 301 via the semiconductor support substrate electrode 413 and the package terminal 301 is connected to the second power source line 204 in the network 200 as shown in FIG. 1.

Herein, a terminal 401 is connected to VDD1 (power source potential at the network side in the interface device)

in FIG. 1 and a terminal 402 is connected to GND1 ground line (ground potential at the network side) 102.

Further, a terminal 403 is connected to VDD2 power source line 103 at the controller side, and a terminal 404 is connected to GND2 ground line 104 at the controller side.

Further, the input and output signal terminals 701 and 702 serve as input and output signal terminals at the side of the controller 700 in the isolator 400.

Now, an operation of the present embodiment will be explained.

At first, an instance when data are received from the network 200 in FIG. 1 will be explained, the transceiver 300 receives signals from the first signal line 202 and the second signal line 203 in the network 200 and transmits the same to the controller 700 via the isolator 400.

Then, the controller 700 judges an addressee of the data received from the network 200 and if the addressee is for the interface device 100, the controller 700 transmits the received data to the field apparatus 800. At this instance, if the field apparatus is, for example, an actuator, the received data is reflected to a control amount for the actuator.

Now, an instance when data are transmitted from the field apparatus 800 to the network 200 will be explained.

If the field apparatus is, for example, a sensor, the controller 700 receives a signal corresponding to a physical quantity detected in the sensor.

The controller 700 at first judges whether the network 200 is available and after converting the signal into a data format for the network, the data are transmitted to the transceiver 300 via the isolator 400.

The transceiver 300 converts the input data so as to match the electrical specification of the network 200 and transmits the signals onto the network 200.

The regulator 500 converts the voltage (for example, voltage of 24V) supplied from the network 200 into an operation voltage (for example, voltage of 5V) for the transceiver 300 and the isolator 400.

Further, in the present embodiment the transceiver 300 and the isolator 400 are formed and integrated on the same SOI substrate 414 as shown in FIGS. 2(a) and 2(b), however, the regulator 500 and the controller 700 also can be integrated on the same SOI substrate 414.

Now, back to the explanation on the operation of the present embodiment as shown in FIGS. 2(a) and 2(b), the network side region 408 constituted by the thin film silicon layer is connected to the second power source line 204 in the network 200, and the semiconductor support substrate region 411 is also connected to the second power source line 204 in the network 200 via the semiconductor support substrate electrode 413 and the terminal 301.

Therefore, the network side region 408 and the semiconductor support substrate region 411 follows up a power source potential variation in the network 200 while being kept at exactly the same potential, as a result, even if the voltage in the network 200 varies, no potential difference is caused between the network side region 408 and the semiconductor support substrate region 411.

Further, both the transceiver 300 and the isolator circuits 405 and 406 are formed in the network side region 408, as a result, in the present embodiment, even if noises are induced in the network 200, the potential between the transceiver 300 and the isolator circuits 405 and 406 and the semiconductor support substrate region 411 never varies and no potential difference due to noises is caused.

Accordingly, in the present embodiment, even if a power source noise is induced in the network 200, electric charge accumulation and depletion in the buried insulation thin film 412 are easily suppressed and possible characteristic deterioration of the elements is sufficiently prevented.

Further, also in the present embodiment, the transceiver 300 formed in the network side region 408 includes MOS transistors having a high break down voltage as its constitutional elements.

Herein, the MOS transistor having a high break down voltage is required to form an element region into a deeper region in the semiconductor support substrate side in comparison with a MOS transistor operating below 5V, and is thus likely to be affected by noises from the semiconductor support substrate.

However, in the present embodiment, even if noises are induced at the power source in the network 200, no potential difference due to the power source noises induced in the network 200 is caused between the semiconductor support substrate region 411 and the network side region 408, therefore, no influence due to noises affects to the elements and a stable circuit operation can be achieved.

On the other hand, even in the present embodiment, a potential difference due to noises from the network 200 caused between the thin film silicon layer in the controller side region 407 and the semiconductor support substrate region 411 can not be suppressed.

Therefore, in the present embodiment, in the region of the thin film silicon layer at the controller side such as a part of the isolator circuits and an interface circuit with the controller are formed.

Now, as is well known in this field, all of these the circuits can be constituted by usual MOS transistors having operating voltage below 5V, and in such instance, the respective MOS transistors can be formed on the surface region of the thin film silicon layer which locates distantly from the semiconductor support substrate.

Thus, also in the present embodiment, the respective MOS transistors constituting these circuits are formed on the surface region of the thin film silicon layer so as to locate distantly from the side of the semiconductor support substrate region 411, as a result, influence of noise voltage which is primarily applied to the region at the controller side in the buried insulation film 412 never reaches the MOS transistors having an operating voltage below 5V, therefore, the characteristic of the circuit elements in the controller side region 407 never changes extremely due to the influence by the noise induced electric field.

Accordingly, in the present embodiment, since the semiconductor support substrate region 411 is connected to the network power source as well as the MOS transistors having a high break down voltage are formed in the semiconductor region 408 at the network side, the transceiver 300 and the isolator 400 be formed on the same SOI and the size reduction and the lowering of power consumption of the interface device can be easily realized.

Figure 4A:
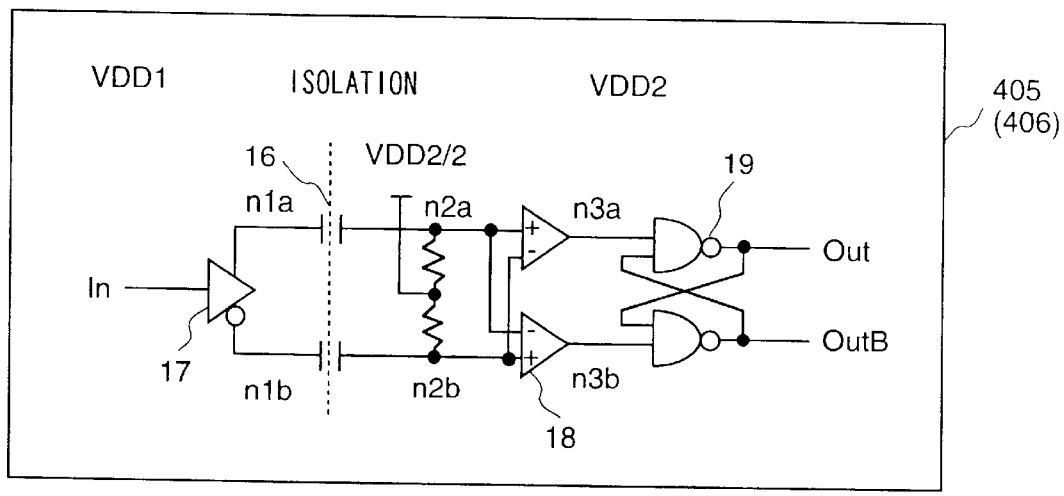
FIGS. 4(a) and 4(b) are explanatory views showing an example of an isolator circuit in the embodiment according to the present invention.
Figure 4B:
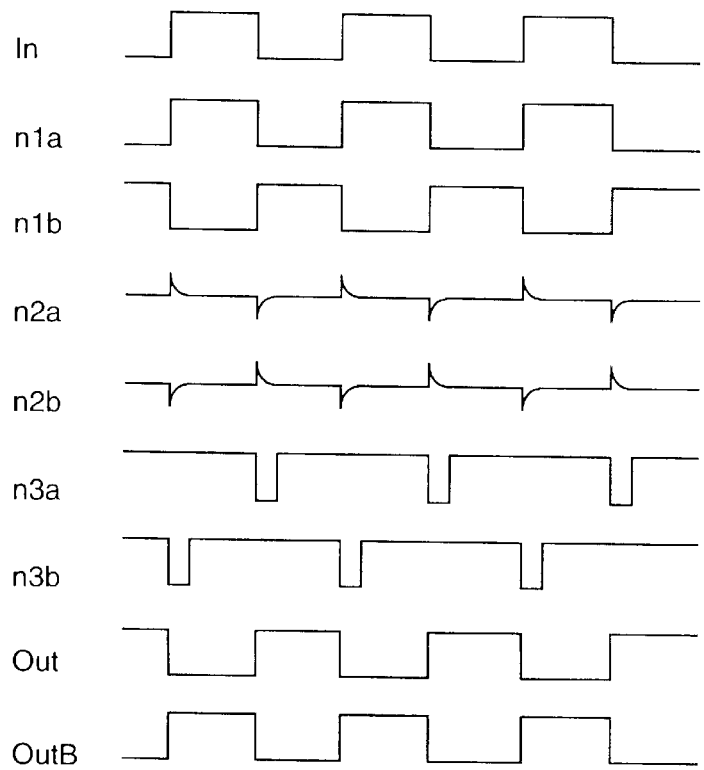

Now, the isolator 400 in the present embodiment will be explained in detail with reference to FIGS. 4(a) and 4(b), wherein FIG. 4(a) shows the circuit structure thereof and FIG. 4(b) is waveform diagrams for explaining the operation thereof.

FIG. 4(a) shows, as an example, the signal reception use isolator circuit 405, however, since the structure and operation of the signal transmission use isolator circuit 406 are substantially the same as the signal reception use isolator circuit 405 except that the input in and the output out are simply interchanged, only the signal reception use isolator circuit 405 will be explained hereinbelow.

The isolator circuit 405 is constituted by a buffer circuit 17 which produces complementary signals based on signals from one system and drives therewith, a capacitor element (electrostatic capacitor element) 16 having an electrical insulation function, resistors n2a and n2b which constitute a high pass filter together with the capacitor element 16, a comparator circuit 18 which converts the complementary differential waveform passed through the capacitor element 16 into pulse signals and amplifies the same and a flip-flop circuit 19 which latches the output pulse signals from the comparator circuit 18.

Now, the operation of the isolator circuit 405 will be explained with reference to FIG. 4(b).

When a signal in from the network 200 (or controller 700) is input to the buffer circuit 17, complementary signals n1a and n1b are output.

Herein, the high pass filter constituted by the capacitor element 16 and the resistors n2a and n2b produces differential signals n2a and n2b in synchronism with rising and trailing edges of the signals n1a and n1b.

Thereafter, these differential signals n2a and n2b are input to the comparator circuit 18 to produce signals n3a and n3b.

Then, these pulse signals n3a and n3b are input to the RS flip-flop 19, thereby, complementary signal Out and OutB which are restored to the same shape as of the input signals are output from the RS flip-flop 19.

Figure 5:
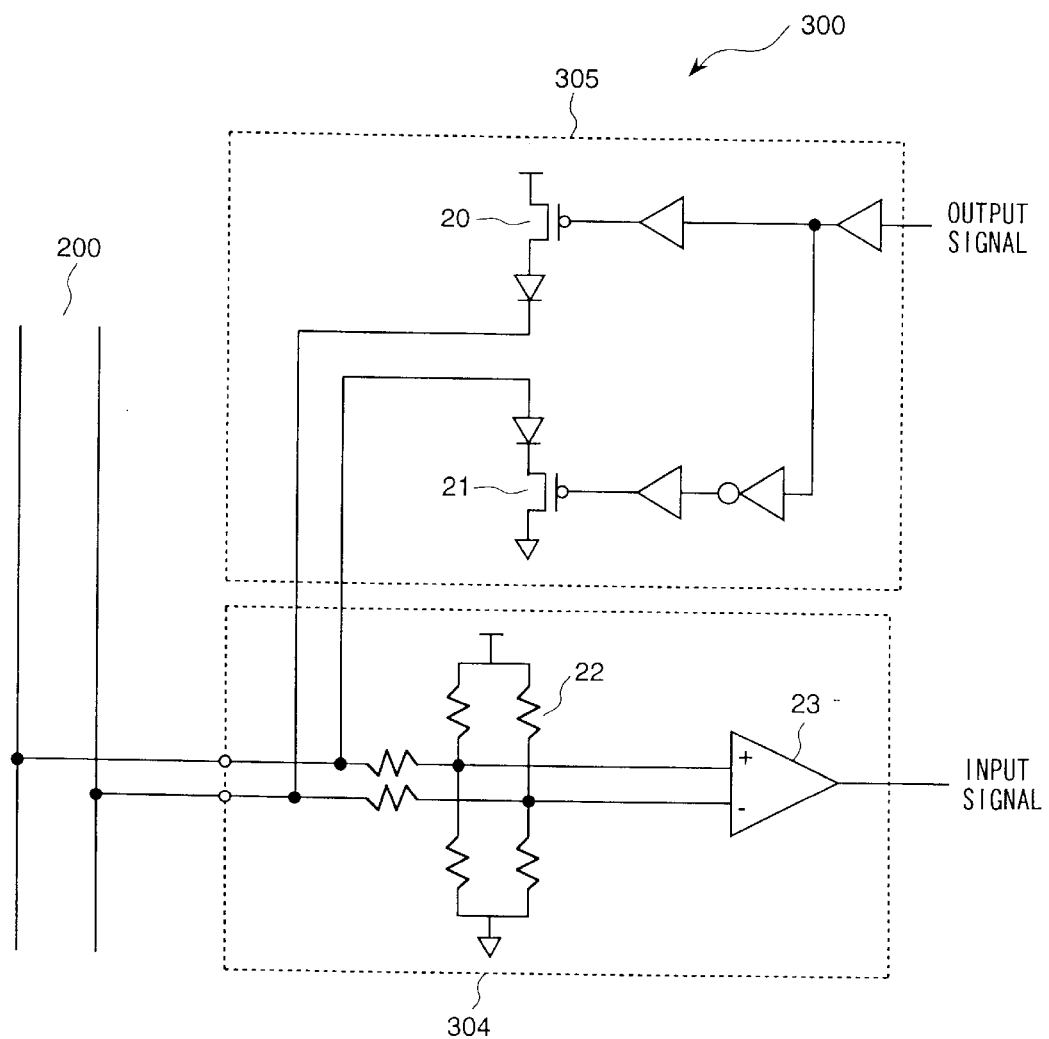
FIG. 5 is a circuit diagram showing an example of a transceiver in the embodiment according to the present invention.

Now, an example of the transceiver 300 in FIG. 1 embodiment will be explained with reference to FIG. 5.

The network 200 is designed to communicate with digital complementary signals constituted by two pieces of signal lines.

The transceiver 300 is constituted by a receiver circuit 304 and a driver circuit 305 and is connected to the network 200.

The receiver circuit 304 is constituted by a resistor network 22 and an input comparator circuit 23.

The resistor network 22 functions to bias the network 200 and to set the signal level therefrom as well as to reduce noise signals from the network 200 and to transmit the same to the input comparator circuit 23.

The output driver 305 is constituted by a PMOS transistor 20 which builds up the output to a high level and an NMOS transistors 21 which falls the output to a low level.

The output signal which is transmitted from such as a computer within the field apparatus 800 and is supplied via the isolator circuit 406 is output from the output driver circuit 305 to the network 200.

Figure 6A:
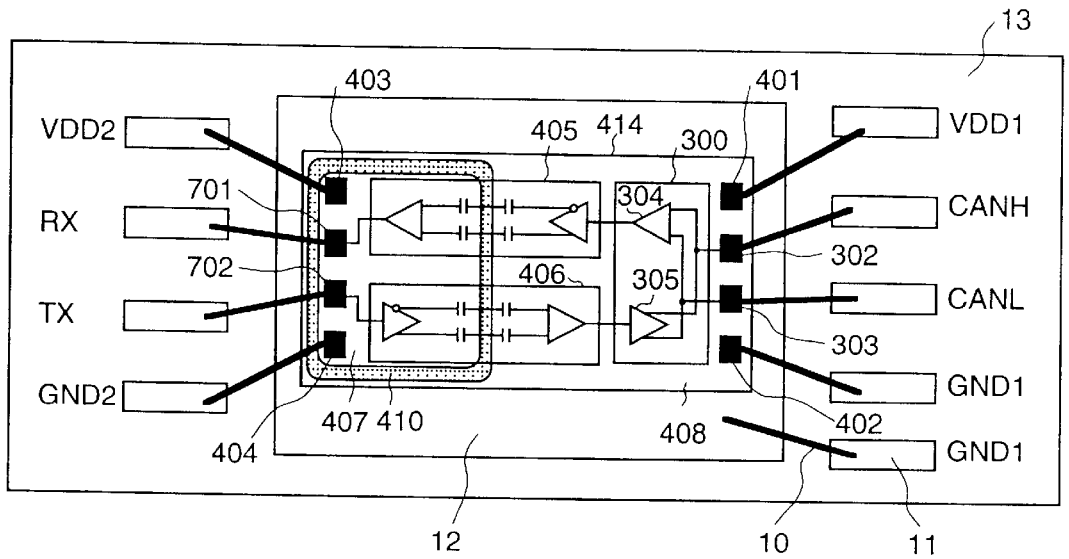
FIGS. 6(a) and 6(b) are explanatory views showing a first packaging example of an interface device according to the present invention.
Figure 6B:
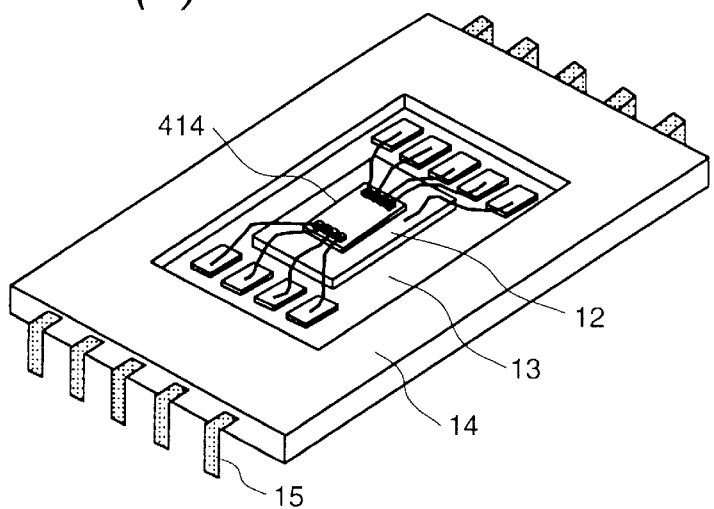

Now, FIGS. 6(a) and 6(b) show one packaging example of a semiconductor integrated circuit device constituting the interface device according to the present invention, for example, in FIG. 2 embodiment the transceiver 300 and the isolator 200 are formed on the same semiconductor substrate 414, and FIGS. 6(a) and 6(b) are an example when the semiconductor substrate 414 is packaged, wherein FIG. 6(a) is a plane view thereof and FIG. 6(b) is a perspective view thereof.

Input and output terminals 302, 303, 701 and 702 and power source terminals 401–404 are respectively connected through wire bondings to corresponding terminals 11 at a terminal portion region 13 in the lead frame substrate 12, and the terminal portions 11 are further connected to the corresponding pins such as pins 15 in the package 14.

The SOI substrate 414 is packaged on the lead frame substrate 12. Namely, the semiconductor support substrate region 411 in FIG. 1 is packaged on the lead frame substrate 12 in FIGS. 6(a) and 6(b) and is electrically connected thereto.

The lead frame substrate 12 is connected via a wire 10 to the terminal portion 11 in the lead frame, thereafter, the lead frame terminal portion 11 is connected via the package pin to the GND side potential in the network.

The present embodiment is an example where the GND power source for the semiconductor circuit and the GND power source for the semiconductor support substrate are respectively connected via separate lead frames to different pins, however, these GND pins are finally connected to the GND side in the network.

Figure 7:
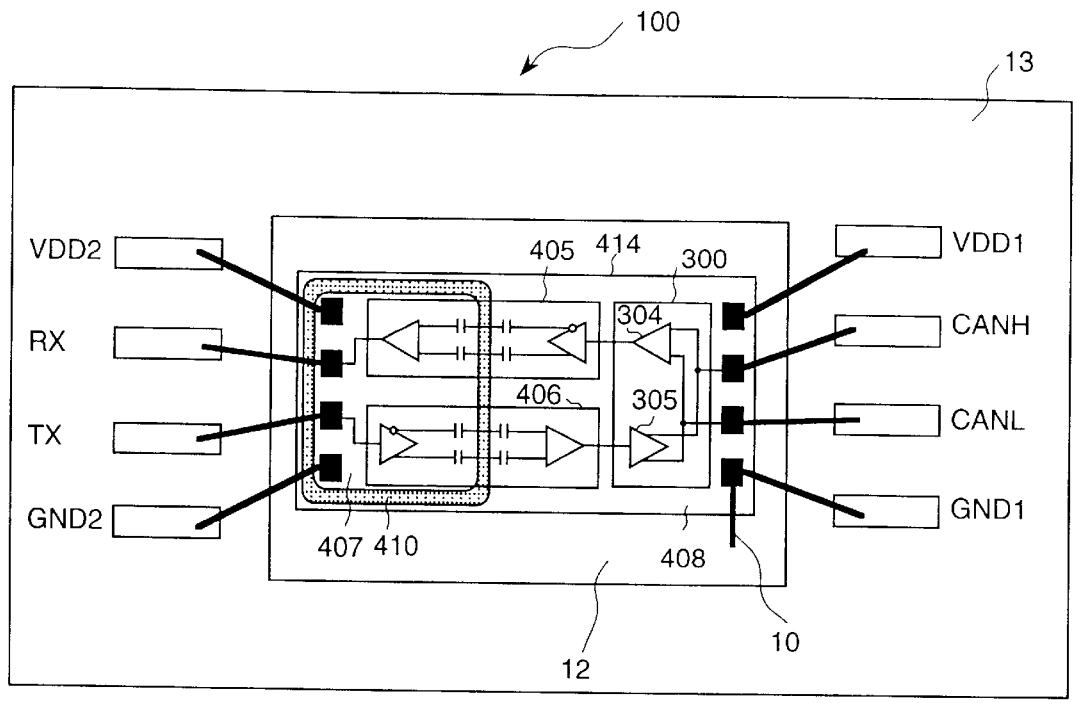
FIG. 7 is an explanatory view showing a second packaging example of an interface device according to the present invention.

FIG. 7 is another packaging example of a semiconductor integrated circuit device constituting the interface circuit 100 according to the present invention in which the lead frame substrate 12 is connected via a wire 10 to the GND in the semiconductor support substrate region 411 and is further connected to a pad for the GND power source in the semiconductor body.

The GND power source pad in the semiconductor body is connected via such as wire and lead to a pin for the package.

Figure 8:
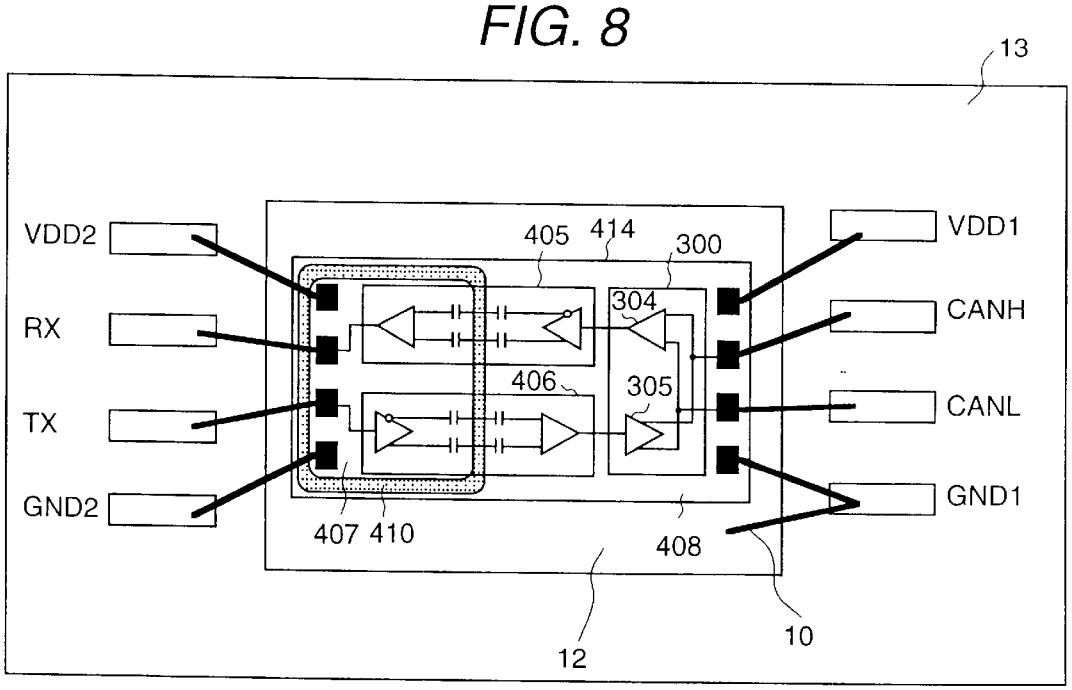
FIG. 8 is an explanatory view showing a third packaging example of an interface device according to the present invention.

FIG. 8 is still another packaging example of a semiconductor integrated circuit device constituting the interface circuit 100 in which the lead frame substrate 12 is connected directly via a wire 10 to a lead frame terminal portion 11 in common.

According with FIGS. 7 and 8 packaging examples number of led frame terminals can be reduced.

Figure 9:
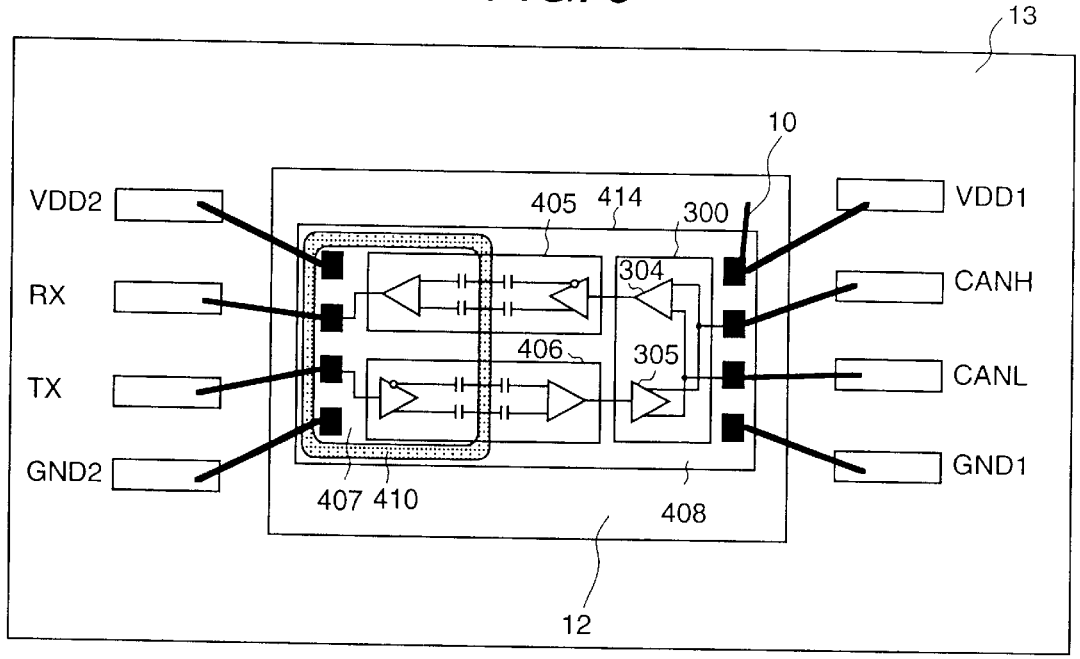
FIG. 9 is an explanatory view showing a fourth packaging example of an interface device according to the present invention.

On the other hand, FIG. 9 is a further packaging example in which the lead frame substrate 12 is connected via a wire 10 to a pad for VDD power source in the semiconductor body, and the VDD power source pad in the semiconductor body is likely connected via such as a wire and lead to a pin in the package.

Figure 10:
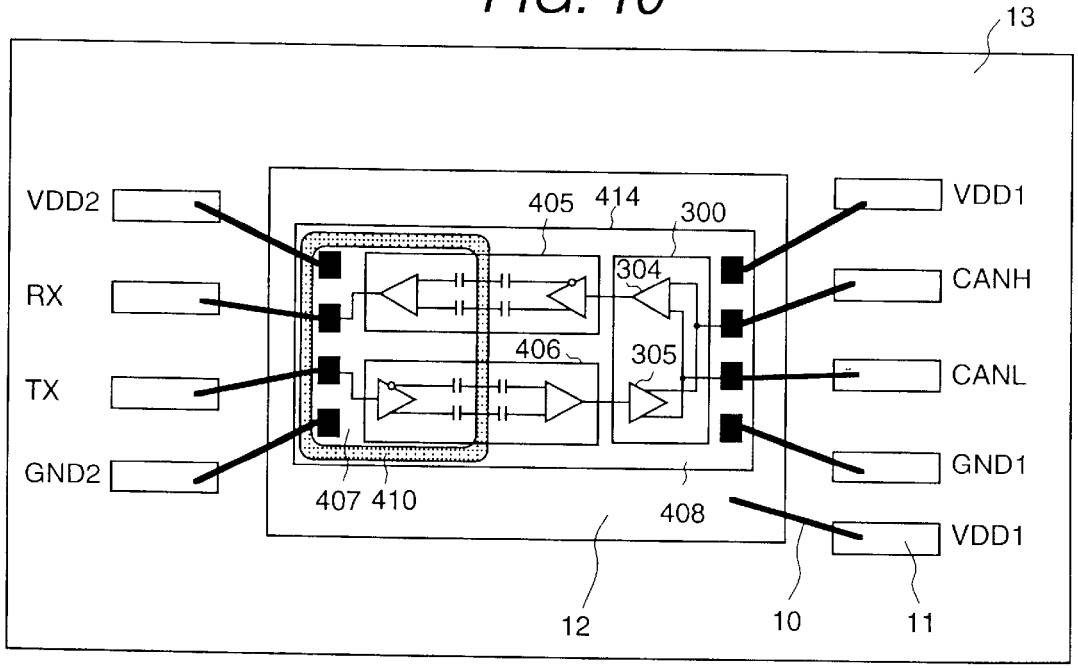
FIG. 10 is an explanatory view showing a fifth packaging example of an interface device according to the present invention.

FIG. 10 is a still further packaging example in which the lead frame substrate 12 is connected via a wire 10 to VDD1 terminal in the lead frame terminal portion 11, and the lead frame terminal portion 11 is connected via a pin in the package to the VDD side potential in the network.

FIG. 10 packaging example is an example in which VDD power source for the semiconductor circuit and VDD power source for the semiconductor support substrate are respectively connected via separate lead frame terminals to different pins and these VDD pins are finally connected to the VDD side in the network.

Figure 11:
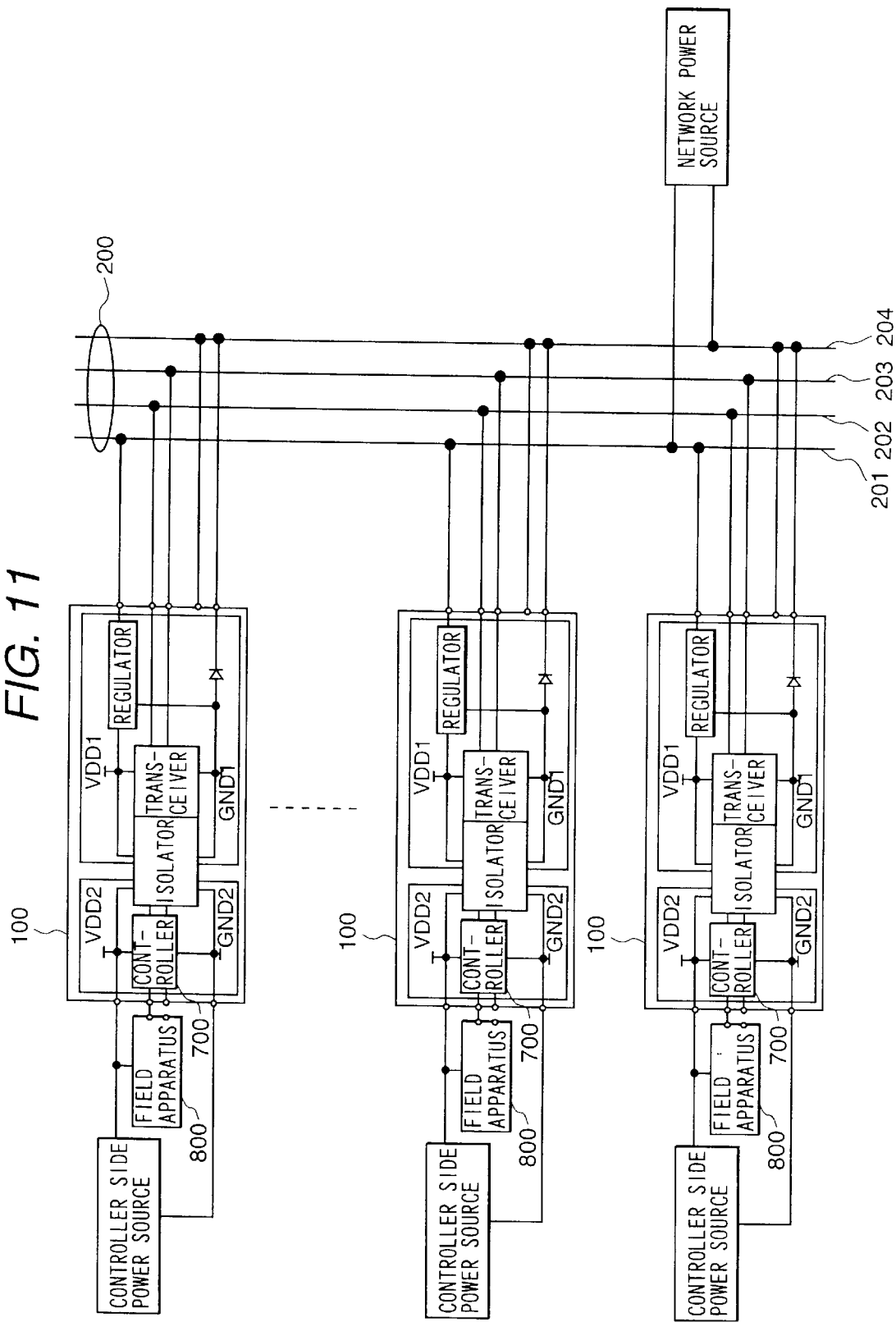
FIG. 11 is an explanatory view showing one embodiment of an interface system which makes use of an interface device according to the present invention.

FIG. 11 is an embodiment when an interface system is constituted by a plurality of interface devices 100 according to the present invention to a network 200.

The respective interface devices 100 are connected in parallel to the power source wiring line 201, the signal wiring lines 202 and 203 and the GND wiring line 204, however, the respective interface devices 100 are electrically insulated each other within the devices by the respective isolators 800.

Accordingly, at the controller side, a controller side power source is provided which is electrically insulated from the network, thereby, an electric power is supplied to the respective interface devices 100 and the field apparatuses connected thereto.

GND potential at the controller side is generally grounded to the earth, therefore, GND potentials of a plurality of controller side power sources are equal.

On the other hand, at the network side, a network power source which supplies an electric power to the entire network is, for example, connected one position thereof, and a plurality of interface devices are supplied an electric power via network having distance of several hundred meters from the starting point power source.

Moreover, the network is, for example, grounded in production lines in a manufacturing work, therefore, a variety of noises are applied to the network.

Accordingly, the GND potential of the network does not necessarily coincide with a GND potential of an interface device which is connected via a plurality of interface devices to a single position of the network which is remote from the network power source. Namely, the GND potential of the network does not also coincide with the GND potential at the controller side.

FIG. 11 embodiment provides an interface system which guarantees a stable operation of the interface devices.

For this purpose, in the present embodiment the SOI semiconductor support substrate which is a constitutional element of the respective interface devices 100 is connected via one of the packaging examples as shown in FIG. 6 through FIG. 9 to the GND wiring line in the network.

As a result, according to the present embodiment, even if a large noise is induced in the network power source, transistors formed on the semiconductor body does not affected by the noise to thereby permit a stable operation.

The interface device according to the present invention is not limited to FIG. 1 embodiment but can be realized in a variety of circuit structures.

Figure 12:
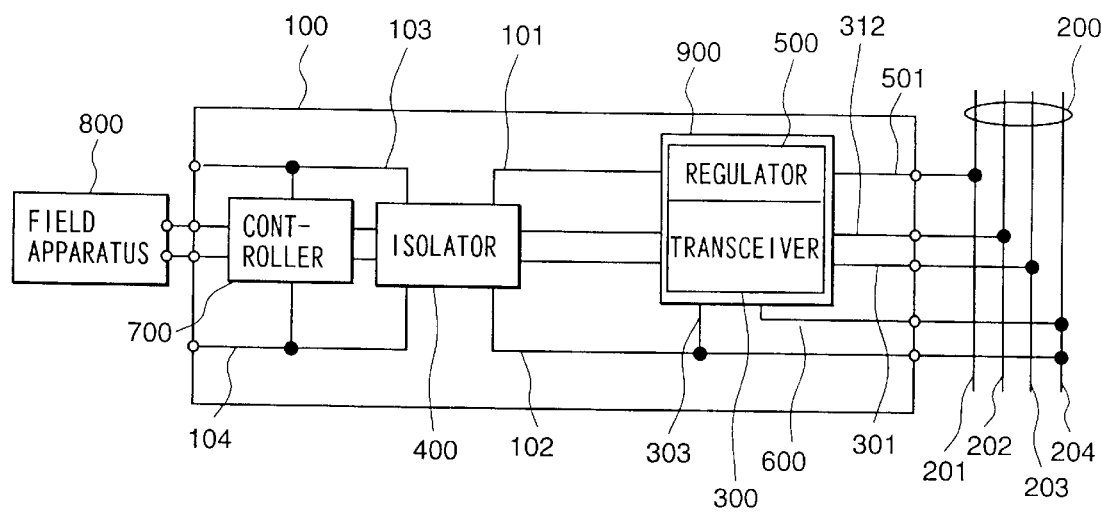
FIG. 12 is a block diagram showing a second embodiment of an interface device according to the present invention.

FIG. 12 is a modification of FIG. 1 embodiment and another embodiment of the present invention in which the transceiver 300 and the regulator 500 are formed on the same SOI substrate 900, and the terminal 311 of the semiconductor support substrate is connected to the network.

Figure 13:
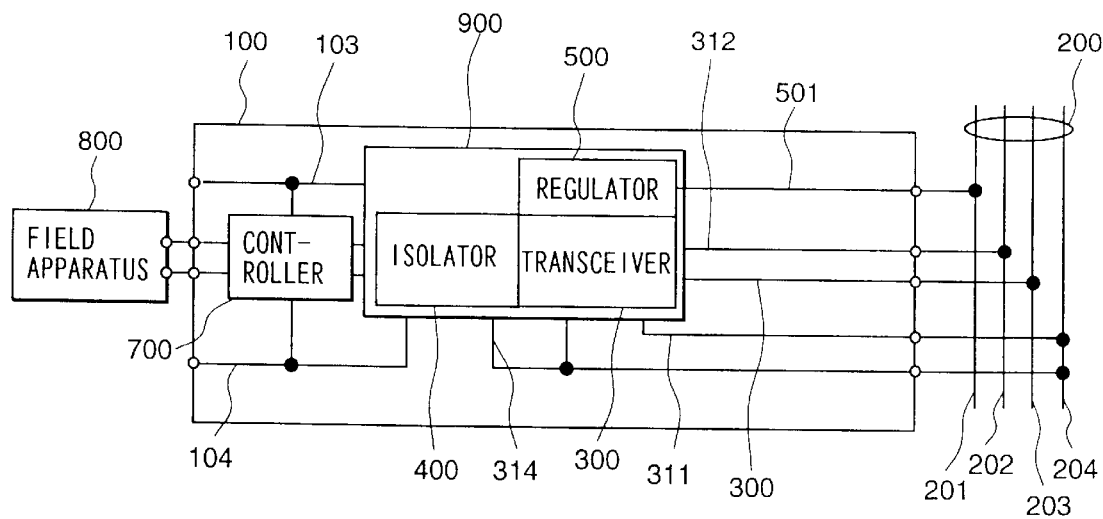
FIG. 13 is a block diagram showing a third embodiment of an interface device according to the present invention.
Figure 14:
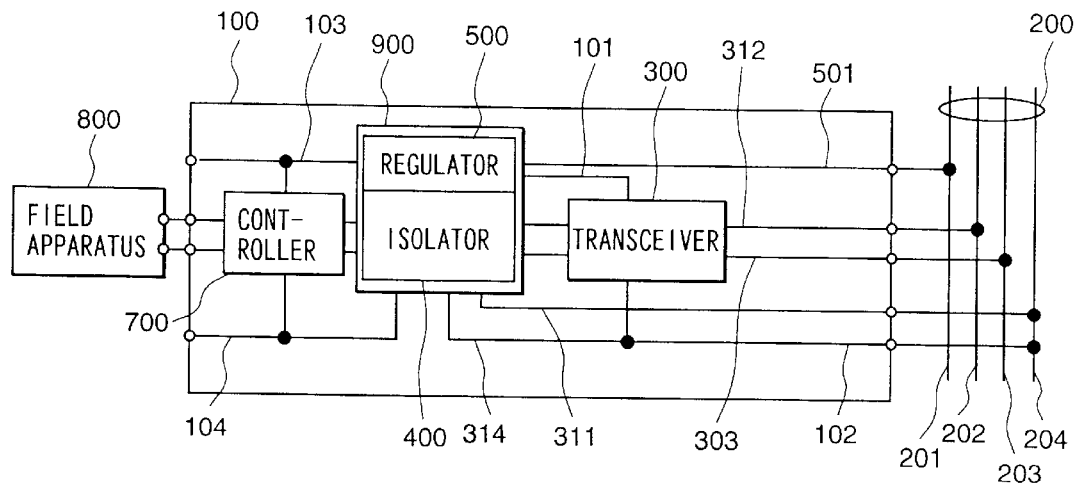
FIG. 14 is a block diagram showing a fourth embodiment of an interface device according to the present invention.

FIG. 13 is still another embodiment in which in addition to the transceiver 300 and regulator 500, the isolator 400 is also formed on the same SOI substrate 900 and the terminal 311 of the semiconductor support substrate is connected to the network, and FIG. 14 is a further embodiment in which the regulator 500 and the isolator 400 are formed on the same SOI substrate 900.

Figure 15:
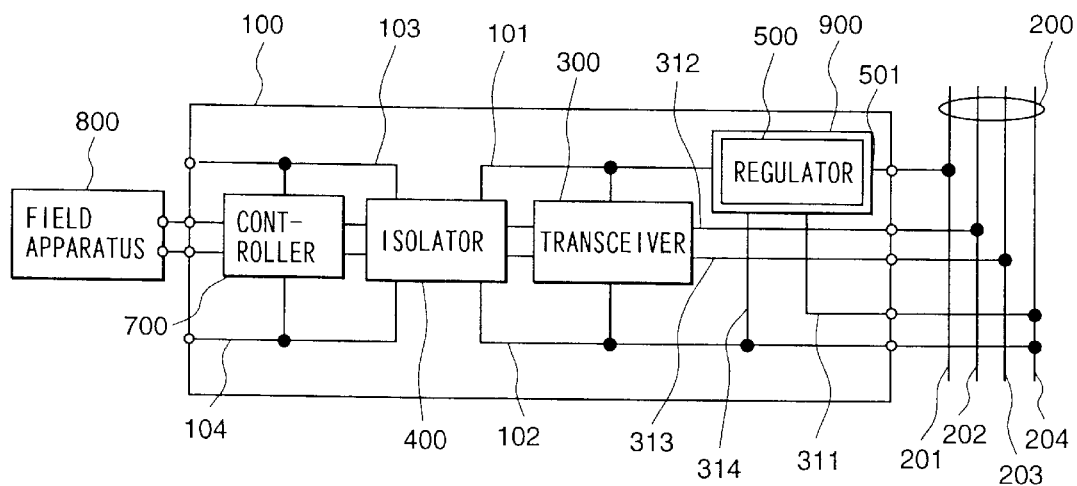
FIG. 15 is a block diagram showing a fifth embodiment of an interface device according to the present invention.
Figure 16:
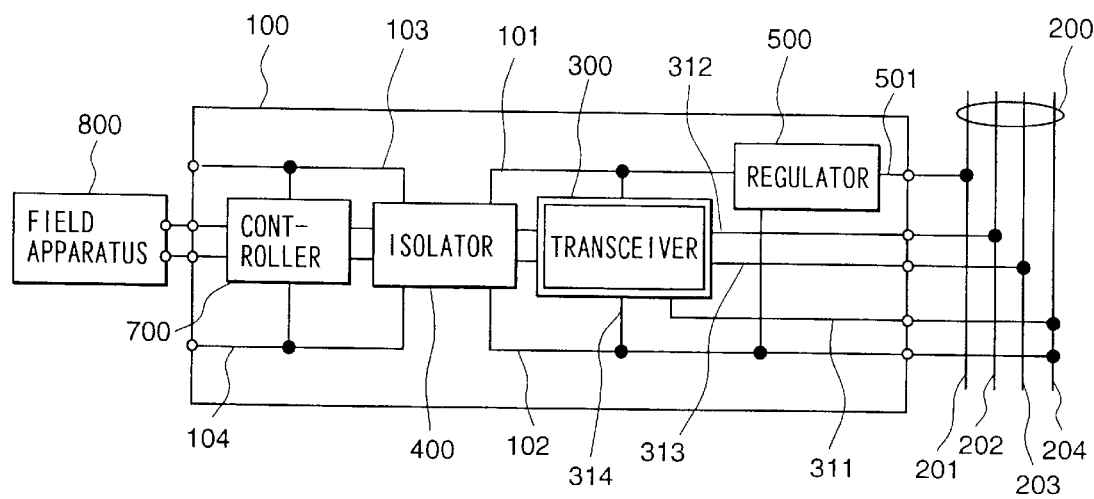
FIG. 16 is a block diagram showing a sixth embodiment of an interface device according to the present invention.
Figure 17:
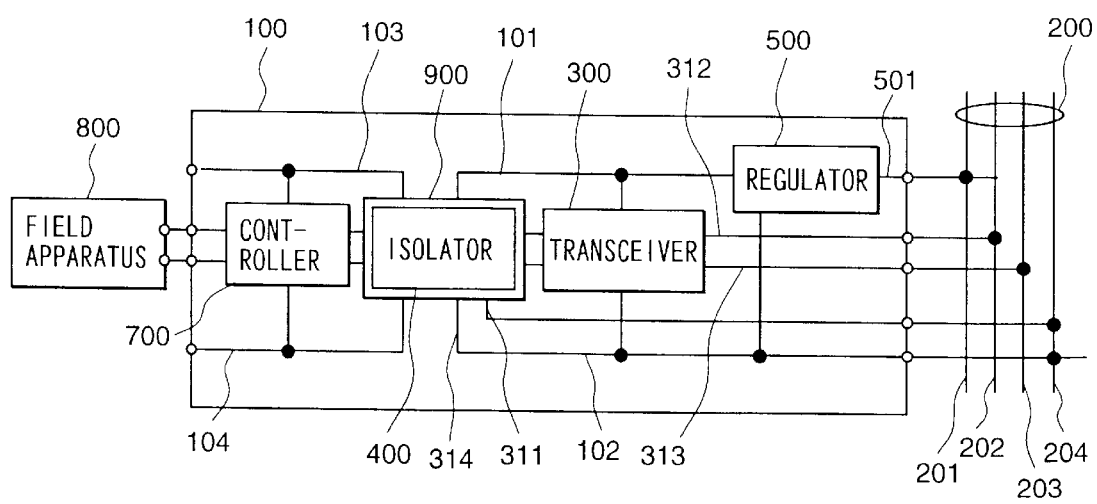
FIG. 17 is a block diagram showing a seventh embodiment of an interface device according to the present invention.

Further, FIG. 15 is a modification of FIG. 1 embodiment and a still further embodiment according to the present invention in which only the regulator 500 is formed on a separate SOI substrate 900 and the terminal 311 connected to the semiconductor support substrate is connected to the network, FIG. 16 is a still further embodiment in which only the transceiver 300 is formed on a separate SOI substrate 900, and further FIG. 17 is a still further embodiment in which only the isolator 400 is formed on a separate SOI substrate, and the terminal 311 connected to the semiconductor support substrate is connected to the network.

Figure 18:
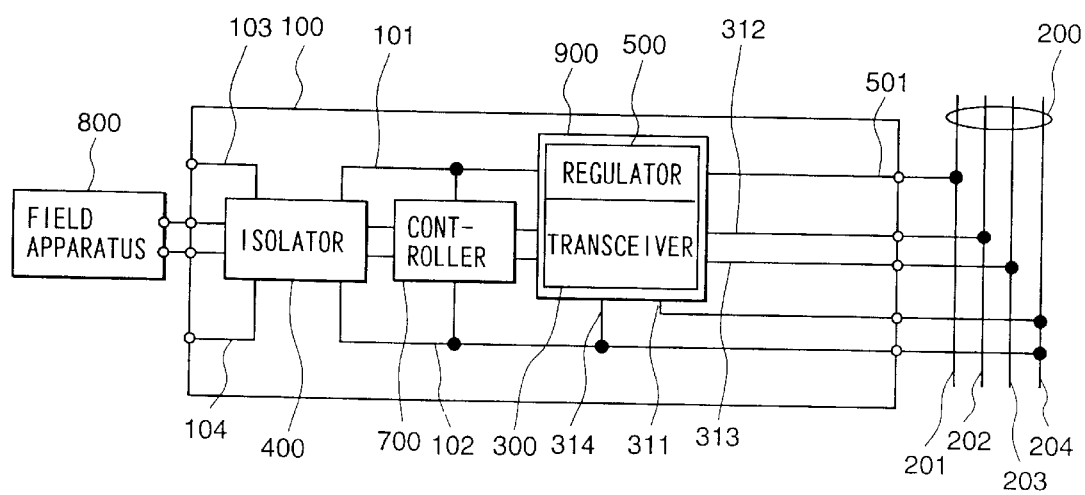
FIG. 18 is a block diagram showing an eighth embodiment of an interface device according to the present invention.

On the other hand, FIG. 18 is a modification of FIG. 1 embodiment and a still further embodiment according to the present invention in which the isolator 400 is disposed between the controller 700 and the field apparatus 800, the transceiver 300 and the regulator 500 are formed on the same SOI substrate and the terminal 311 connected to the semiconductor support substrate is connected to the network.

According to the present invention, when forming a network transceiver and an on-chip isolator on a dielectric isolation substrate and operating the thus formed interface device by supplying from a network, even if a large common noise is induced from the network, the interface device can perform a stable operation, thereby, a capacitive type isolator having a small power consumption in comparison with a photo coupler can be formed in an on-chip structure together with the network transceiver, as a result, an interface device with a low power consumption can be realized.

Further, according to the present invention, with the lowering of power consumption in the interface device an advantage as a system including the same can be obtained. Namely, since a plurality of interface devices are connected to a network, an amount of electric power to be supplied thereto from the network can be reduced, thereby, the capacity of the network power source can be reduced.

Still further, as a result of the above, a voltage drop in the network power source line can be reduced, number of interface devices which are connectable to the network can be increased as well as the extending length of the network can be increased.

What is claimed is:

1. An interface device comprising:
    at least two semiconductor regions separated from a support substrate region via a dielectric body;
    an electrical isolation between an integrated circuit formed in the respective semiconductor regions, provided by a static capacitance;
    means for keeping the potential of one of the semiconductor regions, in which the integrated circuits being connected to a network are formed, at a potential of a power source line for the network, wherein the interface device includes a package and the support substrate region is connected to a pin in the package via an electrode and a lead frame.

2. An interface device according to claim 1, characterized in that the integrated circuits being connected to the side of the network includes a communication function for an integrated circuit in another interface device connected to the network.

3. An interface device according to claim 1, wherein a plurality of interface devices are connected via a common network.

4. An interface device comprising:
    at least two semiconductor regions separated from a support substrate region via a dielectric body;
    an electrical isolation between an integrated circuit formed in the respective semiconductor regions, provided by a static capacitance;
    means for keeping the potential of one of the semiconductor regions, in which the integrated circuits being connected to a network are formed, at a potential of a power source line for the network, wherein the support substrate region is connected to a power source electrode in the integrated circuits being connected to the side of the network.

5. An interface device according to claim 4, characterized in that the integrated circuits being connected to the side of the network includes a communication function for an integrated circuit in another interface device connected to the network.

6. An interface device according to claim 4, wherein a plurality of interface devices are connected via a common network.

7. An interface device comprising:
    at least two semiconductor regions separated from a support substrate region via a dielectric body;
    an electrical isolation between an integrated circuit formed in the respective semiconductor regions, provided by a static capacitance;

means for keeping the potential of one of the semiconductor regions, in which the integrated circuits being connected to a network are formed, at a potential of a power source line for the network, wherein the support substrate region is connected to a power source line in the network.

8. An interface device according to claim 7, characterized in that the integrated circuits being connected to the side of the network includes a communication function for an integrated circuit in another interface device connected to the network.

9. An interface device according to claim 7, wherein a plurality of interface devices are connected via a common network.

10. An interface device comprising:

at least two semiconductor regions separated from a support substrate region via a dielectric body and in which an electrical isolation between an integrated circuit formed in the in the respective semiconductor regions is provided by a static capacitance, characterized in that the integrated circuits being connected to the side of the network is provided with a first device having a first break down voltage characteristic and a second device having a second break down voltage characteristic lower than the first break down voltage characteristic and the first device is supplied from a first power source and the second device is supplied from a second power source which is insulated from the first power source.

11. An interface device comprising:

at least two semiconductor regions separated from a support substrate region via a dielectric body;

an electrical isolation between an integrated circuit formed in the in the respective semiconductor regions is provided by a static capacitance, characterized in that the integrated circuits being connected are provided with a first device having a first break down voltage characteristic and a second device having a second break down voltage characteristic lower than the first break down voltage characteristic and the first device is supplied from a first power source and the second device is supplied from a second power source which is insulated from the first power source.

* * * * *